United States Patent [19]

Naimpally et al.

[11] Patent Number: 5,325,125
[45] Date of Patent: Jun. 28, 1994

[54] INTRA-FRAME FILTER FOR VIDEO COMPRESSION SYSTEMS

[75] Inventors: Saiprasad V. Naimpally, Langhorne, Pa.; Hee-Yong Kim, Plainsboro, N.J.

[73] Assignee: Matsushita Electric Corporation of America, Secaucus, N.J.

[21] Appl. No.: 950,473

[22] Filed: Sep. 24, 1992

[51] Int. Cl.⁵ ............................................. H04N 7/133
[52] U.S. Cl. .................................. 348/402; 348/408; 348/608
[58] Field of Search ....................... 358/133, 141, 167; H04N 7/133

[56] References Cited

U.S. PATENT DOCUMENTS

| | | | |
|---|---|---|---|
| 4,999,705 | 3/1991 | Puri | 358/136 |
| 5,079,621 | 1/1992 | Daly | 358/133 |
| 5,121,191 | 6/1992 | Cassereau | 358/133 |
| 5,202,760 | 4/1993 | Tourtier | 358/133 |

OTHER PUBLICATIONS

J. V. Hu & L. R. Rabiner, "Design Techniques fot Two-Dimensional Digital Filters", IEEE Trans. on Audio and Electroacoustics, AU-20, No. 4, pp. 249-257, Oct. 1972.

"MPEG Video Simulation Model Three (SM3)", Source: ISO Simulation Model Editorial Group, ISO-IEC/JTC1/SC2/WG11, Jul. 25, 1990.

L. R. Rabiner & B. Gold, "Theory and Application of Digital Signal Processing", Prentice-Hall, Inc., pp. 438-483 (1975).

Primary Examiner—Howard W. Britton
Attorney, Agent, or Firm—Ratner & Prestia

[57] ABSTRACT

A video signal encoder uses an encoding system such as that developed by the Moving Picture Experts Group (MPEG). A key component of this encoding system reduces the number of bits required to encode the video signal. Apparatus according to the present invention, filters out high diagonal frequencies in the spatial domain of a video signal. Specifically, two dimensional (2-D) filtering is performed on frames of a video signal to filter out high diagonal spatial frequencies before the video signal is separated into blocks. These blocks may be encoded in fewer bits due to elimination of noise components and other image components having high diagonal frequencies.

20 Claims, 10 Drawing Sheets

INTRA-FRAME FILTER FOR VIDEO COMPRESSION SYSTEMS

The present invention is embodied in a high-definition video encoding system which exhibits increased the compression efficiency while maintaining a high quality reproduced image, specifically, two dimensional (2-D) filtering is performed on frames of a video signal to filter out a range of high diagonal spatial frequencies, before the video signal is encoded.

BACKGROUND OF THE INVENTION

Significant reduction in video bandwidth for storage and transmission purposes is desirable in various applications such as compact disc video and high-definition television. One type of video compression system which has received considerable attention lately is that proposed by the Moving Pictures Expert Group (MPEG), a committee within the International Standards Organization (ISO). The MPEG system is described in a paper entitled, "*MPEG Video Simulation Model 3 (SM3)*" by the Simulation Model Editorial Group, available from ISO as ISO-IEC/JTC1/SC2/WG11/N0010 MPEG 90/041, 1990 which is hereby incorporated by reference for its teachings on the MPEG video signal encoding method. This system is related to the Conditional Motion Compensated Interpolation (CMCI) video encoding system described in U.S. Pat. No. 4,999,705 entitled THREE DIMENSIONAL MOTION COMPENSATED VIDEO CODING, which is hereby incorporated by reference for its teachings on video encoding techniques.

The MPEG system integrates a number of well-known data compression techniques into a single system. These include motion-compensated predictive coding, discrete cosine transformation (DCT), adaptive quantization and variable-length coding (VLC). In these systems, the adaptive quantization step is performed on the coefficient values produced by the discrete cosine transform operation for blocks of 64 pixels derived from the input image.

The DCT coefficients are quantized with varying resolution as a function of the amount of data generated by the encoding operation. In a system with a fixed-bandwidth channel, if an individual image frame produces a relatively large amount of encoded data, the quantization step sizes applied to successive frames may need to be increased (made coarse) to reduce the amount of encoded data used to represent those frames. This is done so that the average level of data produced over several frame intervals is able to be transmitted through the fixed-bandwidth channel. If, when the quantizer is applying coarse quantization to the DCT coefficients, an image is encoded which includes an object having relatively few contours, the reproduced image of this object may have undesirable quantization distortion. This distortion would appear as an exaggeration of the contours in the object.

In addition, a larger quantization step size is usually applied to the DCT coefficients that represent the high diagonal spatial frequencies within the block that the DCT coefficients describe, since the human eye is less sensitive to detail along image diagonals than to horizontal or vertical detail. However, this technique may also produce contours in the overall image formed by the blocks since the quantization levels may vary from block to block depending on the varying amount of encoded information produced by surrounding blocks.

SUMMARY OF THE INVENTION

The present invention is embodied in a video encoding system which includes apparatus that filter out a range of high diagonal spatial frequencies in individual image frames. Circuitry in the encoder receives an individual frame and applies it to a finite impulse response (FIR) filter to suppress spatial information in the individual frames which exhibit high diagonal spatial frequencies.

According to one aspect of the invention, the filter includes separable horizontal and vertical component filters.

According to another aspect of the invention, the filter includes a non-separable diagonal filter.

DETAILED DESCRIPTION OF THE EXEMPLARY EMBODIMENTS

Although this invention is described in terms of an MPEG video encoding system, it is contemplated that it may be used with other types of encoding systems in which image frames are encoded, based, in part, on their spatial frequency content.

Figure 1:
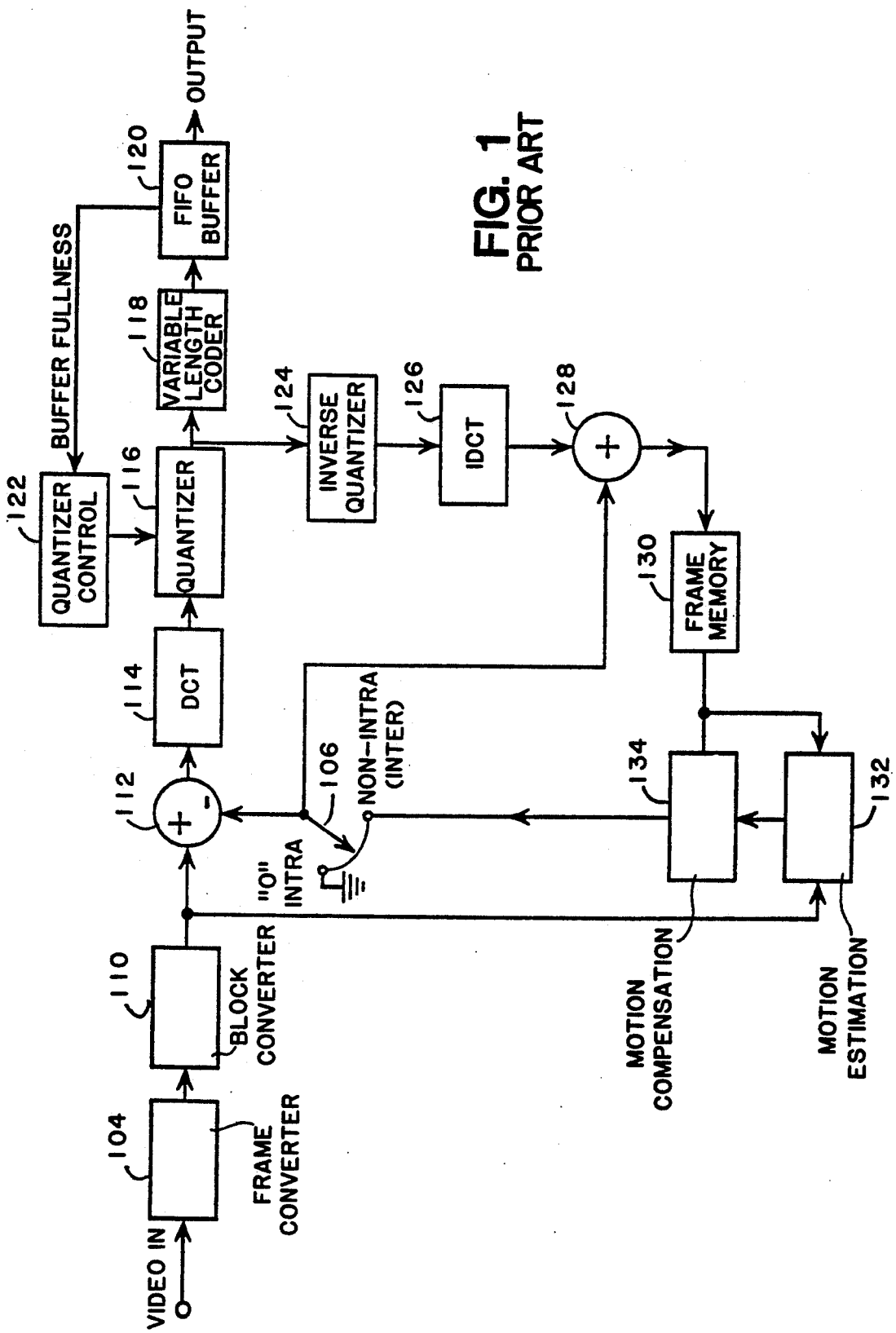
FIG. 1 (Prior Art) is a block diagram of an exemplary video signal encoding system.

An exemplary prior art MPEG encoding system is shown in FIG. 1. In this system, a video signal which describes an image is provided in raster scan order from a video camera (not shown) or other video source.

Figure 3:
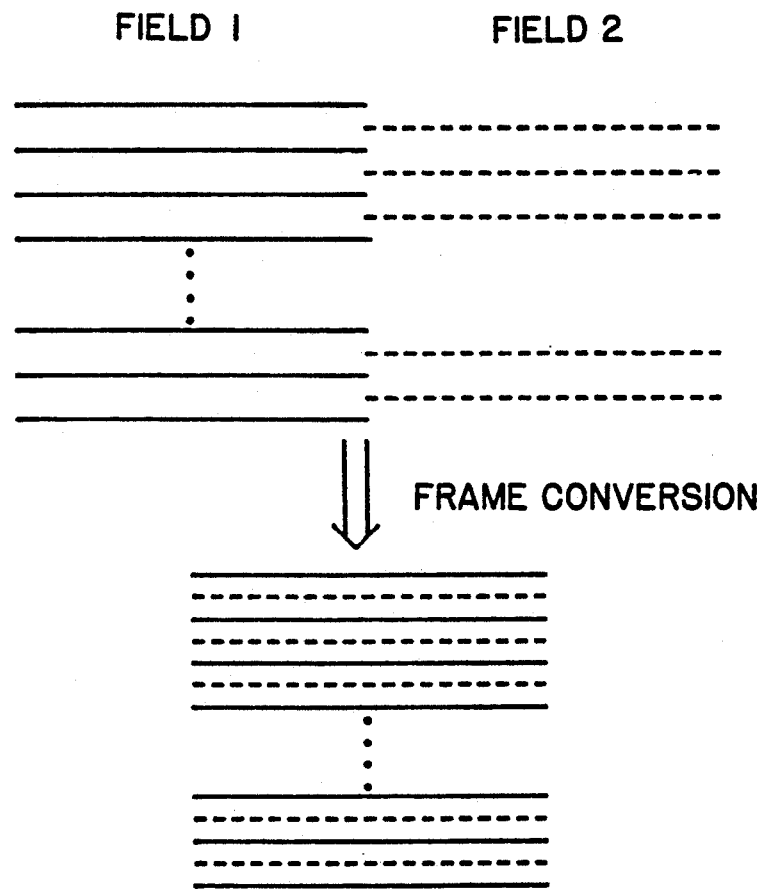
FIG. 3 (Prior Art) is a diagram of video fields and frames which illustrates the function of the frame converter shown in FIGS. 1 and 2.

If the signal is an interlaced signal, the video signal is processed by a conventional frame converter 104 which may include, for example, a conventional random access memory (RAM). The frame converter 104 combines two interlaced fields to generate a single image frame. FIG. 3 shows an example of the process performed by the frame converter 104. Two fields, Field 1 and Field 2 where Field 2 is offset spatially in the vertical direction from Field 1, are combined into a single image frame. If the video signal is not an interlaced signal, then the frame converter 104 would not be necessary.

The video signal representing the image frame generated by the frame converter 104 (if necessary) is applied to a block converter 110. The block converter 110 which may include, for example, a conventional dualport memory, converts the signal from raster scan format to a block format.

In the block format, each frame of the image is represented as a collection of blocks where each block has sixty-four pixels arranged as a matrix of eight horizontal pixels by eight vertical pixels. Each of these pixel values is represented as an eight-bit digital value. The block converter 110 provides these pixel values one block at a time to a subtracter 112.

In non-intra mode, the subtracter 112 subtracts a block provided by motion compensation circuitry 134 from a corresponding block provided by the block converter 110. The subtracter 112 generates blocks of data representing motion-predicted differentially-coded blocks. In intra mode, the subtracter 112 generates blocks of data representing the blocks provided by the block converter 110.

Switch 106 controls whether blocks generated by the subtracter 112 represent motion-predicted differentially-coded blocks (non-intra mode) or the blocks generated by the block converter 110 (intra mode). In non-intra mode, the switch 106 directs blocks of data generated by the motion compensation circuitry 134 to be applied to the subtracter 112. In the MPEG system, the non-intra mode is used for encoding predicted frames such as the predicted anchor frames, P frames. In the intra mode, the switch 106 directs the data value of zero to be applied to the subtracter 112 so that the subtracter 112 generates blocks representing the blocks generated by the block converter 110. In the MPEG system, the intra mode is used for encoding independent (non-predicted) frames such as the independent anchor frames, I frames.

The blocks generated by the subtracter 112 are applied to a discrete cosine transform (DCT) processor 114. The DCT processor 114 applies a discrete cosine transformation to each of the blocks of pixel values to convert them into corresponding blocks of DCT coefficients. Each of the blocks is then rearranged into a linear stream of 64 coefficients using a zigzag scan such as that shown in FIG. 5.

For any block, the first of these coefficients represents the direct current (DC) spatial-frequency component of the pixels in the block and the remaining coefficients represent components at successively higher spatial frequencies.

The coefficient values provided by the DCT processor 114 are applied to a quantizer 116 which translates each coefficient value into a binary value having an assigned number of bits. In general, a larger number of bits is used for the lower-order coefficients than for the higher-order coefficients since the human eye is less sensitive to image components at higher spatial frequencies than to components at lower spatial frequencies. This operation may be performed, for example, by dividing each coefficient value in the linearized block by a respectively different value, which is proportional to the frequency of the coefficient. An array containing these values may be transmitted with the signal to allow the signal to be dequantized at its destination.

In addition, the number of bits assigned to each coefficient value may be changed in response to reduction factors provided by quantizer control circuitry 122, described below. These factors may be applied to divide each coefficient value in the block by the factor before or after they are divided by the array of frequency-dependent values. The quantizer 116 produces a stream of digital values which is applied to a variable-length coder 118 and to an inverse quantizer 124.

The variable-length coder (VLC) 118 encodes the data using, for example, an amplitude run-length Huffman-type code. Using the Huffman-type code, the variable-length coder 118 assigns fewer bits to frequently occurring combinations of data values and run lengths of zeros. The zig-zag pattern of coding the DCT coefficient values shown in FIG. 5 may increase the number of zeros that occur sequentially since there tends to be more image information at low frequencies than the high spatial frequencies and thus more zero value DCT coefficients as the frequency represented by the DCT coefficient increases.

The signals produced by the variable-length coder 118 are applied to a first-in-first-out (FIFO) buffer 120 which stores the values for transmission at a predetermined rate as the signal output. The output rate of the VLC 118 tends to bursty due the use of a Huffman-type coding and the quantizer 116. The FIFO buffer 120 smooths out the output rate of the VLC 118 to generate data values representing a video bitstream at a constant bit-rate for fixed bandwidth channel applications. For variable bandwidth channel applications, the FIFO buffer 120 may only be needed to prevent data from being generated at a rate greater than some upper limit rate.

As described above, the output signal produced by the quantizer 116 is also applied to an inverse quantizer 124. The inverse quantizer 124 reverses the operation performed by the quantizer 116 to produce approximate discrete cosine transform coefficients representing each block of the encoded image. These coefficient values are applied to an inverse discrete cosine transform (IDCT) processor 126. This processor reverses the discrete cosine transform operation to produce values representing the values provided by the subtracter 112.

These values are applied by the IDCT circuitry 126 to one input port of an adder 128. The other input port of the adder 128 is coupled to receive the motion-compensated values from the previous frame which were used in the subtracter 112 in non-intra mode to generate the differentially-encoded motion-predicted values. Adder 128 sums these values to produce decoded pixel values which are stored in the frame memory 130.

Motion-estimation circuitry 132 is coupled to receive both the blocks of pixels produced by the block converter 110 and the decoded pixels as stored in frame memory 130. Circuitry 132 compares the blocks provided by the block converter 110, block by block, to corresponding pixels from a previously encoded frame in a search region centered around the same frame coordinates. The block of pixels from the previous frame which exhibits the smallest difference with respect to the input block, according to some mathematical function of the two blocks, is identified as the best matching block.

When the best matching block has been located, it is provided by the motion-compensation circuitry 134 to the subtracter 112 to generate the differentially-encoded motion-compensated pixel values. After these values have been encoded and decoded, this block is also provided to the adder 128 to generate the decoded block.

Different types of images produce encoded frames having differing numbers of bits. For example, a video image of a large monochrome object such as a close-up of a single flower may need only a small number of bits in the encoded data since the scene may not have much high spatial frequency content. While a scene of garden full of flowers may need a relatively large number of bits since the scene may have a significant amount of high spatial frequency content.

In a fixed bandwidth channel application, the quantizer controller 122 compensates for the varying rates at which encoded information is generated by controlling the quantization step-size applied by the quantizer 116. In an exemplary embodiment of the invention, the FIFO-buffer 120 has one low-water mark and three high-water marks which define differing amounts of stored data. The low-water mark may, for example, indicate that the FIFO buffer 120 is fifty percent full; the first high-water mark, that it is seventy-five percent full; the second high-water mark, that it is ninety percent full; and the last high-water mark, that it is ninety-five percent full.

In response to the various buffer-fullness signals, the quantizer-control circuitry 122 conditions the quantizer 116 to apply different levels of quantization resolution to the coefficient values provided by the DCT 114. In response to the low-water mark buffer-fullness signal, the quantizer-control circuitry 122 would condition the quantizer 116 to apply a relatively fine level of quantization resolution to the coefficient values. In response to each of the high-water mark signals, the control circuitry 122 would cause the quantizer 116 to apply successively coarser levels of quantization resolution to the coefficient values. Once any of the coarse quantization levels have been applied, the fine quantization level will only be applied after the next low-water mark buffer-fullness signal has been received from the FIFO-buffer 120.

Thus, as the FIFO-buffer 120 holds successively more data, the quantizer 116 produces fewer bits of encoded data by more coarsely-quantizing the DCT coefficients representing the received image. If, when the quantizer is applying coarse quantization to the DCT coefficients, an image is encoded which includes an object having relatively few contours, the reproduced image of this object may have undesirable quantization distortion.

The number of high water marks, low water marks and quantization adjustment values used in this description are exemplary. In an actual implementation, a larger or smaller number of each of these values may be desirable.

As noted earlier, however, the human eye is less sensitive to high diagonal spatial frequencies where high diagonal spatial frequencies are those frequencies which have a high vertical and high horizontal spatial frequency component. Individual image frames may contain detail at these frequencies which may increase the amount of data generated by encoding the image frame. In addition, a significant portion of the image content at the high diagonal spatial frequencies may be the result of noise rather than the presence of any spatial detail in the image at those frequencies.

Figure 2:
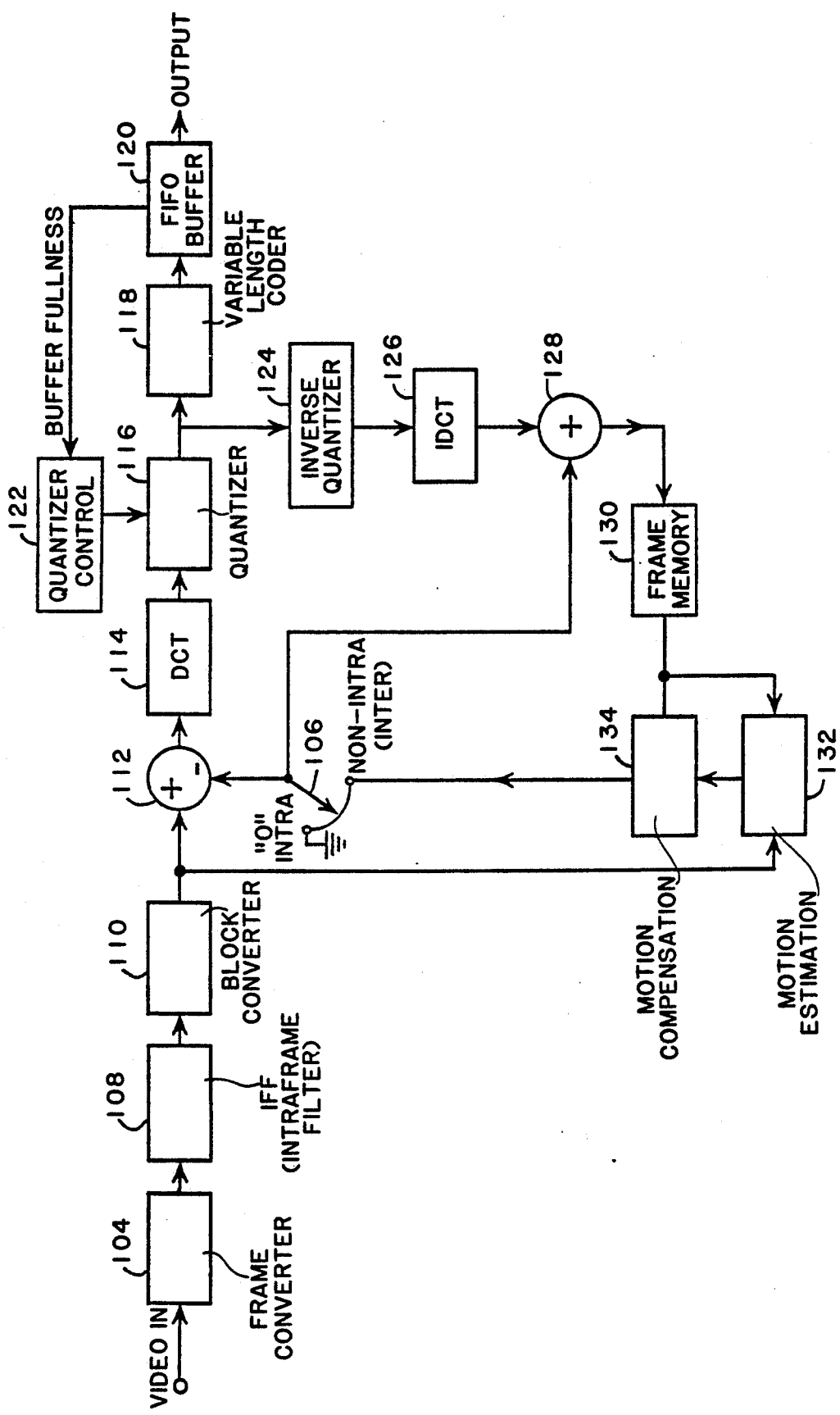
FIG. 2 is a block diagram of the encoding system shown in FIG. 1 modified to include an embodiment of the present invention.

FIG. 2 is a block diagram of a video encoding system according to the MPEG standard which includes an embodiment of the present invention. The encoding system shown in FIG. 2 differs from that shown in FIG. 1 by the addition of a intra frame filter (IFF) 108.

Briefly, the IFF 108 generates an image frame representing the image frame provided by the frame converter 104. In this generated image a range of high diagonal spatial frequencies have been suppressed. The inventors have found that this modification of the MPEG video encoding system is very effective in increasing the compression efficiency of the video encoding system and thus reducing the entropy of the video signal. In addition, the modification, while reducing the entropy of signal, does not significantly affect the quality of the reproduced image and may, in certain image frames, enhance the quality of the reproduced image.

The exemplary IFF 108 receives data values describing an image frame from the frame converter 104 and subjects the data values to a two-dimensional filter to suppress a range of high diagonal spatial frequencies in the image frame. As noted above, because the human eye is less sensitive to high spatial frequencies than low spatial frequencies and because a portion of the information at the high spatial frequencies generally results from noise rather than image content, suppressing a range of high diagonal spatial frequencies in the image frame generally does not cause noticeable distortion in the image and may improve image quality.

The compression efficiency of the video encoding system may be increased by the suppression of the high diagonal spatial frequencies because more of the DCT coefficients generated by the DCT 114 may be zero. This reduces the entropy of the signal. As noted above, the DCT 114 applies the data values describing a block provided by the subtracter 112 to generate DCT coefficients which represent the respective presence of certain spatial frequencies in the block. If a range of high diagonal spatial frequencies is suppressed in an image frame, a portion of the DCT coefficients which represent higher spatial frequencies may be zero or quantized to zero by the quantizer 116.

Figure 5:
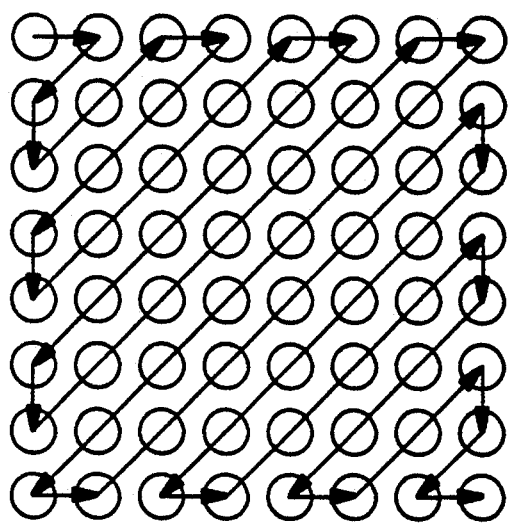
FIG. 5 (Prior Art) is a pixel diagram which illustrates the zigzag scan structure used by the encoders shown in FIGS. 1 and 2.

In addition, since the quantized DCT coefficients generated by the quantizer 116 are applied to the VLC 118 in the zig-zag pattern shown in FIG. 5, the DCT coefficients which represent higher spatial frequencies will be in sequential order. This result may allow the run length coding process performed in the VLC 118 to significantly reduce the number of bits necessary to represent the quantized DCT coefficients generated by the quantizer 116 since one or more DCT coefficients which are quantized to zero may be applied sequentially to the VLC 118.

Subsequently, in a fixed bandwidth channel application, the quantization level may be made finer thus improving picture quality because on average fewer DCT coefficients are needed to describe a block applied to the DCT 114 In a variable bandwidth channel application, the maximum bandwidth needed to represent the image frame may be reduced.

Figure 4A:
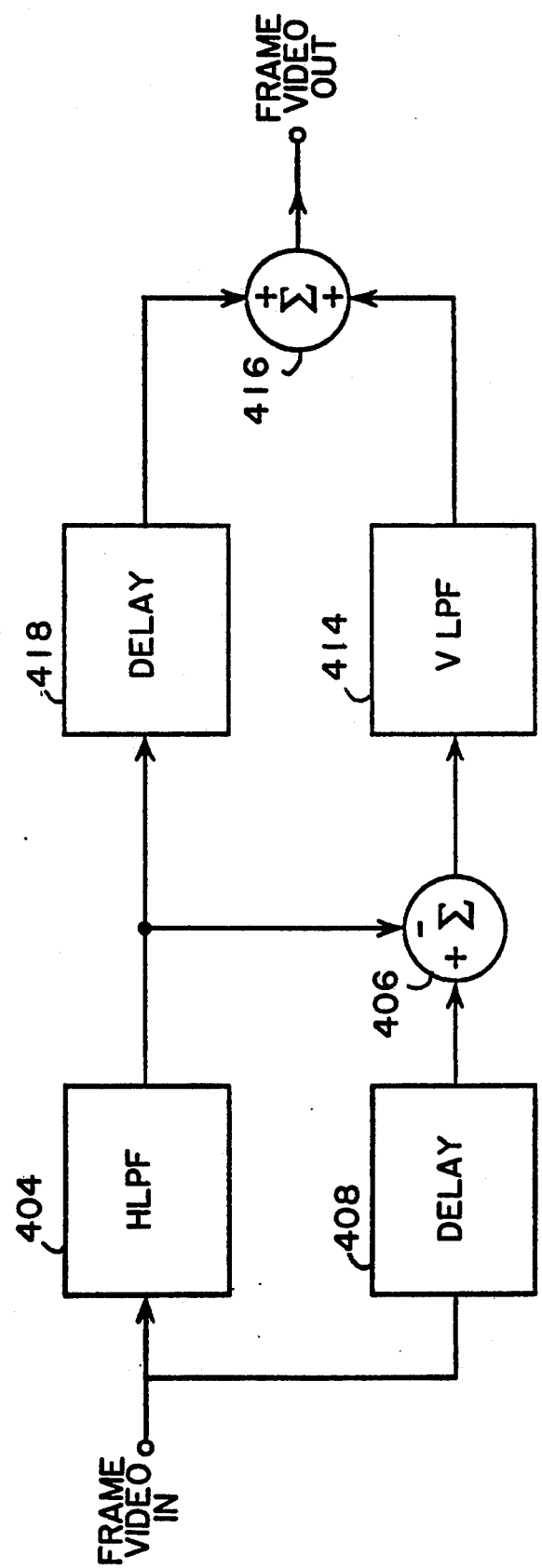
FIGS. 4a to 4d are block diagrams of exemplary intra-frame filter circuitry suitable for use in the embodiment of the invention shown in FIG. 2.
Figure 4B:
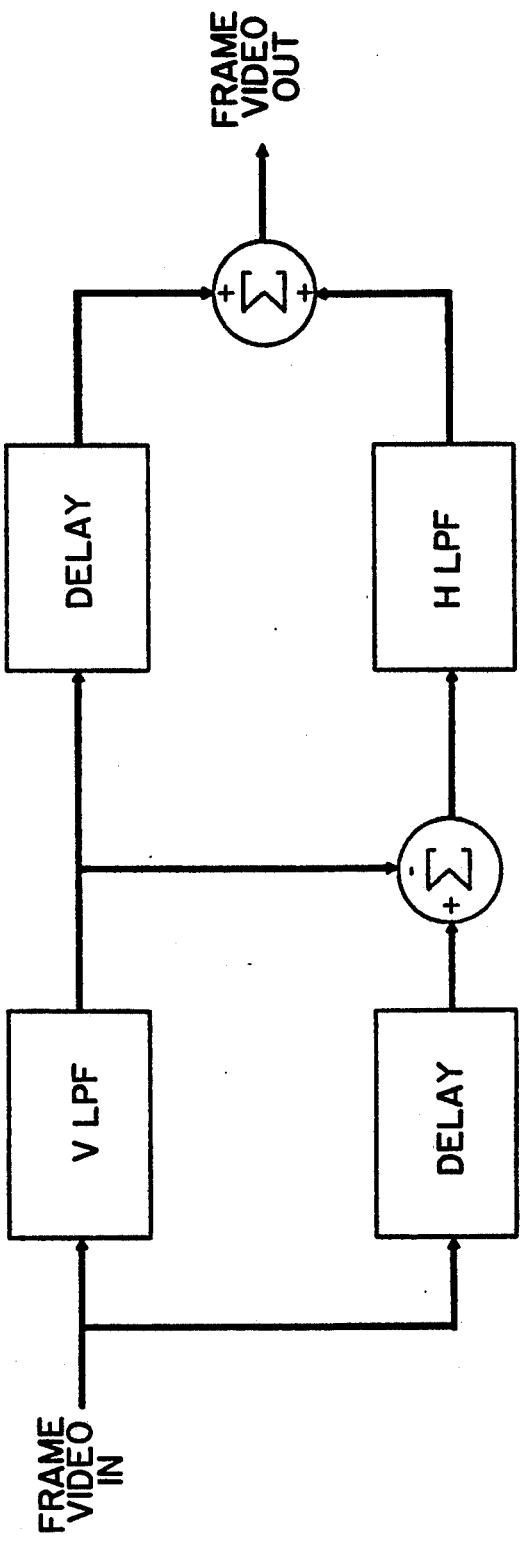
Figure 4C:
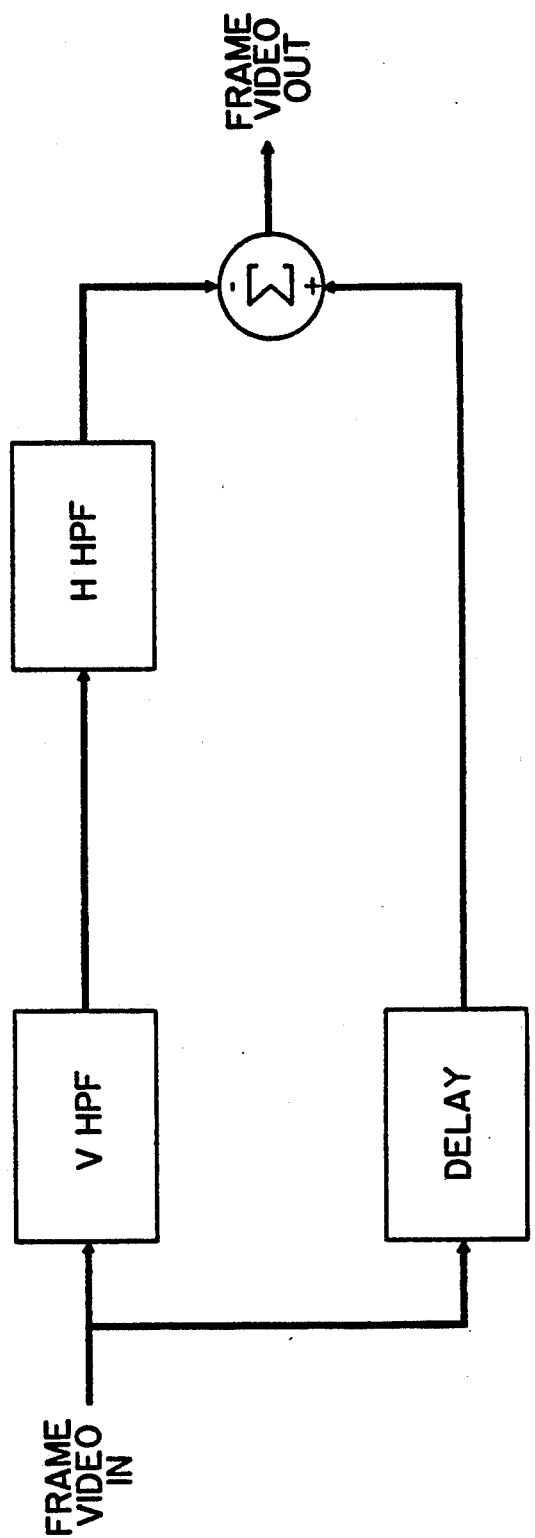
Figure 4D:
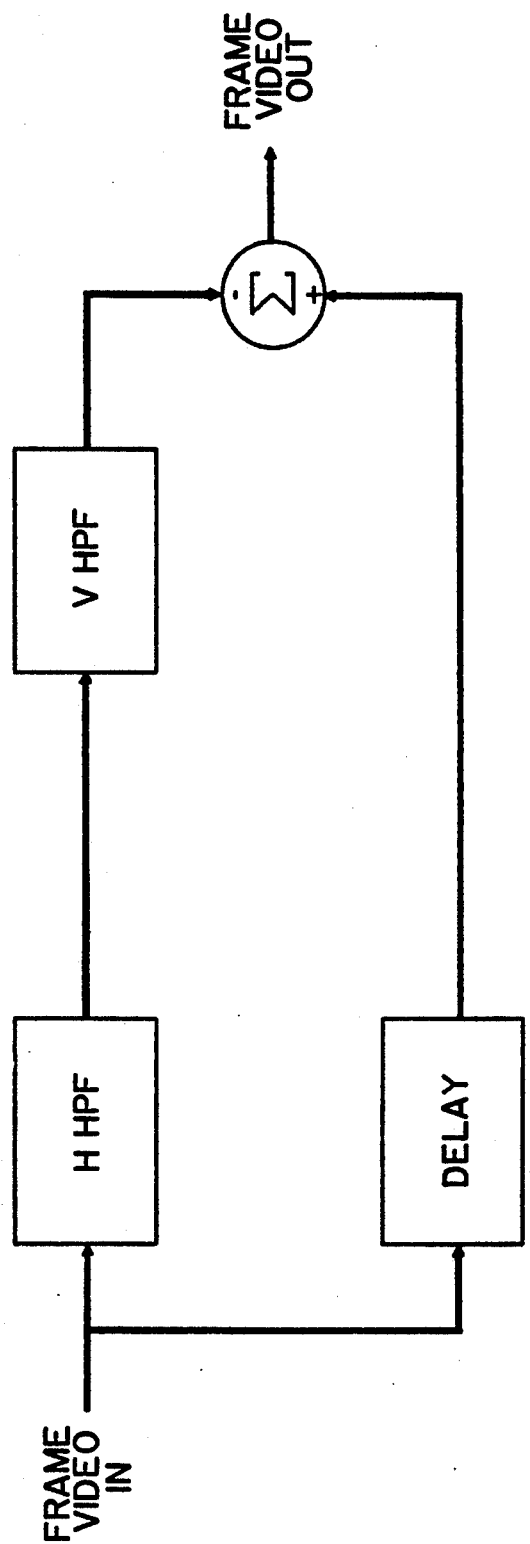
Figure 6:
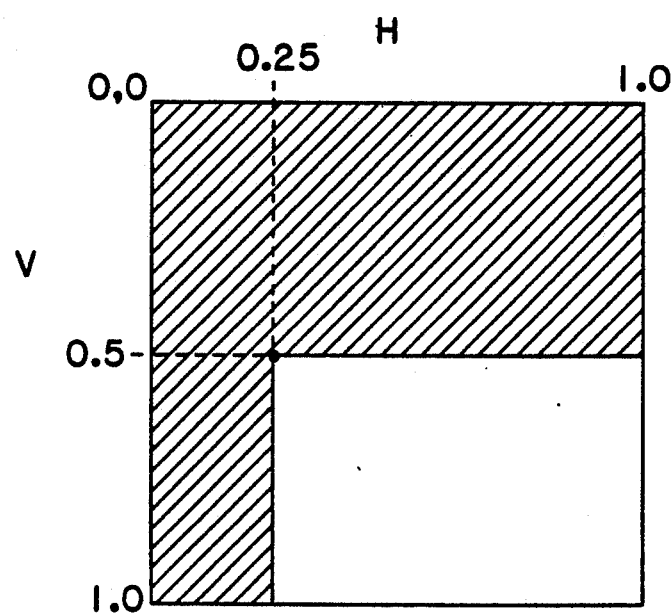
FIG. 6 shows the filtered video spectrum generated by an exemplary filter which may be embodied by the circuitry shown in FIGS. 4a to 4d.

FIGS. 4a to 4d represent equivalent embodiments of an exemplary IFF 108 which suppresses high diagonal spatial frequencies using a separable 2-D filter design. FIG. 6 shows a filtered video spectrum generated by an exemplary filter which may be embodied by the circuitry shown in FIGS. 4a to 4d. The embodiment shown in FIG. 4a is described in detail below. One skilled in the art of video encoding systems will be able to understand the operation of the other equivalent embodiments shown in FIGS. 4b to 4d from the description of the embodiment shown in FIG. 4a.

As shown in FIG. 4a, an exemplary IFF 108 includes a horizontal low pass filter (H LPF) 104, two compensating delays 408 and 418, a vertical low pass filter (V LPF) 414, a subtracter 406 and an adder 416. As noted above, the 2-D filter design embodied in this exemplary IFF is a separable function. Therefore, the 2-D filtering process may be performed along the horizontal and vertical directions independently.

In the embodiment shown in FIG. 4a, the data values describing an image frame are first applied to a horizontal low pass filter (H LPF) 404, where H LPF 404 is a standard FIR filter. The H LPF 404 suppresses all horizontal frequencies beyond a selected cutoff frequency. In FIG. 6, the selected horizontal cutoff frequency is 25% of full bandwidth. In a design where the cutoff frequency in the horizontal direction is 25% of full bandwidth, the filtered video spectrum generated by H LPF 404 would be represented by the rectangular area in FIG. 6 having its upper left corner at horizontal (H) 0.0, vertical (V) 0.0, upper right corner at H 0.25, V 0.0, lower left corner at H 0.0, V 1.0 and lower right corner at H 0.25, V 1.0.

Exemplary filter coefficients for the H LPF 404 which suppress horizontal spatial frequencies beyond 25% of full bandwidth are listed in Table 1 below. This exemplary filter design is an output-weighted FIR filter having 39 symmetrical filter coefficients.

TABLE 1

| | | | | |
|---|---|---|---|---|
| h[−19] | = | h[19] | = | 0.001012 |
| h[−18] | = | h[18] | = | 0.001809 |
| h[−17] | = | h[17] | = | 0.001719 |
| h[−16] | = | h[16] | = | 0.000000 |
| h[−15] | = | h[15] | = | −0.003215 |
| h[−14] | = | h[14] | = | −0.006116 |
| h[−13] | = | h[13] | = | −0.005720 |
| h[−12] | = | h[12] | = | 0.000000 |
| h[−11] | = | h[11] | = | 0.009555 |
| h[−10] | = | h[10] | = | 0.017149 |
| h[−9] | = | h[9] | = | 0.015269 |
| h[−8] | = | h[8] | = | 0.000000 |
| h[−7] | = | h[7] | = | −0.024023 |
| h[−6] | = | h[6] | = | −0.042893 |
| h[−5] | = | h[5] | = | −0.038861 |
| h[−4] | = | h[4] | = | 0.000000 |
| h[−3] | = | h[3] | = | 0.071101 |
| h[−2] | = | h[2] | = | 0.155213 |
| h[−1] | = | h[1] | = | 0.223289 |
| h[0] | = | | | 0.249424 |

To generate a data value in a certain horizontal spatial position (denoted as h[0] in Table 1), 39 successive data values (samples) in horizontal spatial positions surrounding the data value being generated are multiplied by the appropriate filter coefficients shown in Table 1 and then summed. For example in Table 1, h[1] represents a filter coefficient which is to scale the applied data value one sample after the horizontal spatial position of the data value being generated. Likewise, h[−1] represents a filter coefficient which is to scale the applied data value one sample before the horizontal spatial position of the data value being generated. Of course, the zero-valued coefficient values may be implemented as skipped taps in the delay line and, so, would not enter into the summing operation.

This scaling and summation process is performed for all the horizontal spatial positions of the data values describing an image frame applied to the H LPF 404.

The data values describing an image frame are also applied to the delay 408 shown in FIG. 4a. The delay 408 delays the applied data values by the amount of time to compensate for the multiplication and addition operations in the H LPF 404. The subtracter 406 applies the data values provided by the delay 408 and the H LPF 404 to generate data values representing the difference between the applied data values. This difference describes a horizontal complementary image frame. The filtered video spectrum of the horizontal complementary image frame generated by the subtracter 406 would be a high-pass spectrum represented by a rectangular area in FIG. 6 having an upper left corner at H 0.25, V 0.0, upper right corner at H 1.0, V 0.0, lower left corner at H 0.25, V 1.0 and lower right corner at H 1.0, V 1.0.

The vertical low pass filter 414 (V LPF), which is also a standard FIR filter, filters the data values provided by the subtracter 406 to generate data values representing a vertical low passed filtered version of the horizontal complementary image frame. In the exemplary filter design shown in FIG. 6, the V LPF 414 suppresses all vertical spatial frequencies above 50% of full bandwidth. The 7 filter coefficients for this exemplary symmetrical filter design are listed in Table 2. V LPF 414 operates in a manner similar to H LPF 404 except that it uses applied data values nearby the vertical spatial position of the data value to be generated. The filtered video spectrum of image frame describing the data values generated by the V LPF 414 using the exemplary filter design listed in Table 2 would be represented by a rectangular area in FIG. 6 having an upper left corner at H 0.25, V 0.0, upper right corner at H 1.0, V 0.0, lower left corner at H 0.25, V 0.5 and lower right corner at H 1.0, V 0.5.

TABLE 2

| | | | | |
|---|---|---|---|---|
| h[−3] | = | h[3] | = | −0.008722 |
| h[−2] | = | h[2] | = | 0.000000 |
| h[−1] | = | h[1] | = | 0.251843 |
| h[0] | = | | | 0.513758 |

The delay 418 applies the data values provided by the H LPF 404 to generate data values representing a delayed version of the horizontally low-pass filtered signal. The delay 418 delays the applied data values by the amount of time to compensate for the subtraction operation in the subtracter 406 and the multiplication and addition operations in the V LPF 414.

The adder 416 applies the data values provided by the delay 418 and the V LPF 414 to generate data values representing the image frame with high horizontal and vertical spatial frequencies (i.e. high diagonal spatial frequencies) suppressed. Samples representing the filtered video image frame with high diagonal spatial frequencies suppressed are provided by the adder 416. The frequency spectrum of this signal is represented by the shaded area in FIG. 6, namely the entire video spectrum area except the rectangular area having an upper left corner at H 0.25, V 0.5, an upper right corner at H 1.0, V 0.5, a lower left corner at H 0.25, V 1.0 and a lower right corner at H 1.0, V 1.0. This result follows by combining the video spectrum areas of the data values provided by the H LPF 404 and by the V LPF 414 as described above.

Figure 7A:
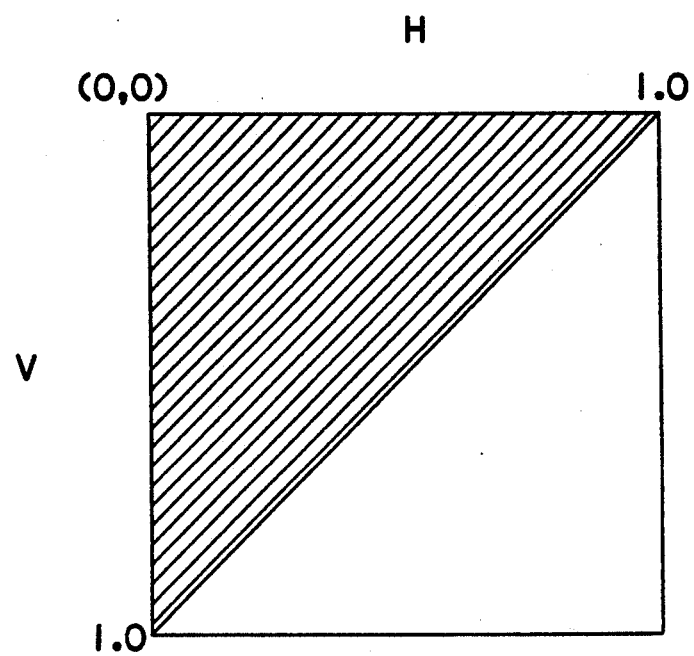
FIGS. 7a and 7b show filtered video spectra for exemplary two-dimensional intra-frame filters suitable for use in the circuitry shown in FIG. 2.
Figure 7B:
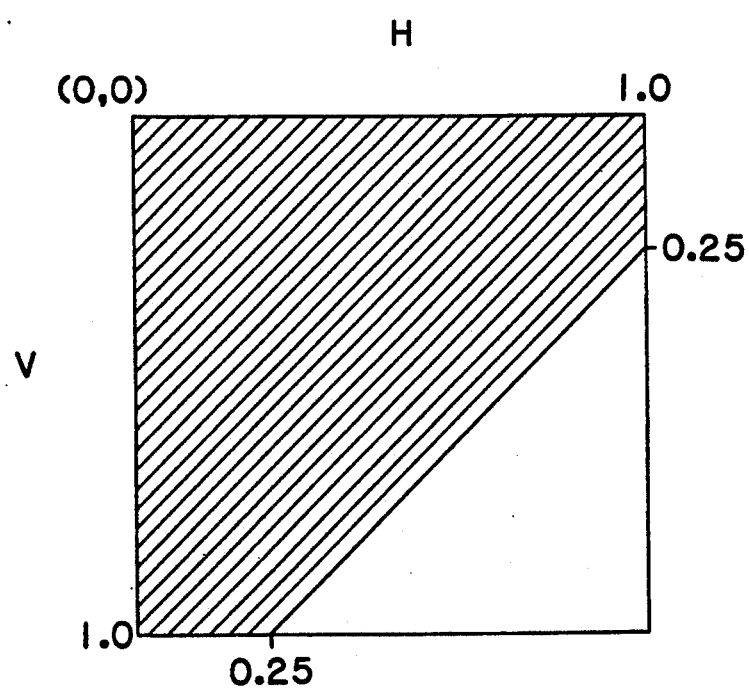

FIGS. 7a and 7b show two filtered video spectra generated by two exemplary filters which may be embodied by the circuitry shown in FIG. 2. These filters are two dimensional (2-D) low pass filters (LPF) which suppress a range of high diagonal spatial frequencies.

The two exemplary embodiments of the IFF illustrated in FIGS. 7a and 7b are obtained using respective 11 by 11 tap two-dimensional FIR filters having the coefficients listed below in Tables 3 and 4, respectively.

TABLE 3

| | | | | |
|---|---|---|---|---|
| hv[−5, −5] | = hv[−5, −5] | = hv[−5, 5] | = hv[5, −5] | = 0.000 |
| hv[−5, −4] | = hv[−4, −5] | = hv[4, −5] | = hv[5, −4] | = 0.020 |
| hv[−4, 5] | = hv[−5, 4] | = hv[4, 5] | = hv[5, 4] | = 0.020 |
| hv[−5, −3] | = hv[−3, −5] | = hv[3, −5] | = hv[5, −3] | = 0.000 |
| hv[−3, 5] | = hv[−5, 3] | = hv[3, 5] | = hv[5, 3] | = 0.000 |
| hv[−5, −2] | = hv[−2, −5] | = hv[2, −5] | = hv[5, −2] | = 0.009 |
| hv[−2, 5] | = hv[−5, 2] | = hv[2, 5] | = hv[5, 2] | = 0.009 |
| hv[−5, −1] | = hv[−1, −5] | = hv[1, −5] | = hv[5, −1] | = 0.000 |
| hv[−1, 5] | = hv[−5, 1] | = hv[1, 5] | = hv[5, 1] | = 0.000 |
| hv[0, −5] | = hv[−5, 0] | = hv[0, 5] | = hv[5, 0] | = 0.007 |
| hv[−4, −4] | = hv[4, 4] | = hv[−4, 4] | = hv[4, −4] | = 0.000 |
| hv[−4, −3] | = hv[−3, −4] | = hv[3, −4] | = hv[4, −3] | = −0.026 |
| hv[−3, 4] | = hv[−4, 3] | = hv[3, 4] | = hv[4, 3] | = −0.026 |
| hv[−4, −2] | = hv[−2, −4] | = hv[2, −4] | = hv[4, −2] | = 0.000 |
| hv[−2, 4] | = hv[−4, 2] | = hv[2, 4] | = hv[4, 2] | = 0.000 |
| hv[−4, −1] | = hv[−1, −4] | = hv[1, −4] | = hv[4, −1] | = −0.012 |
| hv[−1, 4] | = hv[−4, 1] | = hv[1, 4] | = hv[4, 1] | = −0.012 |
| hv[0, −4] | = hv[−4, 0] | = hv[0, 4] | = hv[4, 0] | = 0.000 |
| hv[−3, −3] | = hv[3, 3] | = hv[−3, 3] | = hv[3, −3] | = 0.000 |
| hv[−3, −2] | = hv[−2, −3] | = hv[2, −3] | = hv[3, −2] | = 0.036 |
| hv[−2, 3] | = hv[−3, 2] | = hv[2, 3] | = hv[3, 2] | = 0.036 |
| hv[−3, −1] | = hv[−1, −3] | = hv[1, −3] | = hv[3, −1] | = 0.000 |
| hv[−1, 3] | = hv[−3, 1] | = hv[1, 3] | = hv[3, 1] | = 0.000 |
| hv[0, −3] | = hv[−3, 0] | = hv[0, 3] | = hv[3, 0] | = 0.020 |
| hv[−2, −2] | = hv[2, 2] | = hv[−2, 2] | = hv[2, −2] | = 0.000 |
| hv[−2, −1] | = hv[−1, −2] | = hv[1, −2] | = hv[2, −1] | = −0.060 |
| hv[−1, 2] | = hv[−2, 1] | = hv[1, 2] | = hv[2, 1] | = −0.060 |
| hv[0, −2] | = hv[−2, 0] | = hv[0, 2] | = hv[2, 0] | = 0.000 |
| hv[−1, −1] | = hv[1, 1] | = hv[−1, 1] | = hv[1, −1] | = 0.000 |
| hv[0, −1] | = hv[−1, 0] | = hv[0, 1] | = hv[1, 0] | = 0.179 |
| hv[0, 0] | = 0.441 | | | |

TABLE 4

| | | | | |
|---|---|---|---|---|
| hv[−5, −5] | = hv[5, 5] | = hv[−5, 5] | = hv[5, −5] | = 0.017 |
| hv[−5, −4] | = hv[−4, −5] | = hv[4, −5] | = hv[5, −4] | = −0.020 |
| hv[−4, 5] | = hv[−5, 4] | = hv[4, 5] | = hv[5, 4] | = −0.020 |
| hv[−5, −3] | = hv[−3, −5] | = hv[3, −5] | = hv[5, −3] | = 0.000 |
| hv[−3, 5] | = hv[−5, 3] | = hv[3, 5] | = hv[5, 3] | = 0.000 |
| hv[−5, −2] | = hv[−2, −5] | = hv[2, −5] | = hv[5, −2] | = −0.003 |
| hv[−2, 5] | = hv[−5, 2] | = hv[2, 5] | = hv[5, 2] | = −0.003 |
| hv[−5, −1] | = hv[−1, −5] | = hv[1, −5] | = hv[5, −1] | = 0.006 |
| hv[−1, 5] | = hv[−5, 1] | = hv[1, 5] | = hv[5, 1] | = 0.006 |
| hv[0, −5] | = hv[−5, 0] | = hv[0, 5] | = hv[5, 0] | = 0.001 |
| hv[−4, −4] | = hv[4, 4] | = hv[−4, 4] | = hv[4, −4] | = 0.000 |
| hv[−4, −3] | = hv[−3, −4] | = hv[3, −4] | = hv[4, −3] | = 0.025 |
| hv[−3, 4] | = hv[−4, 3] | = hv[3, 4] | = hv[4, 3] | = 0.025 |
| hv[−4, −2] | = hv[−2, −4] | = hv[2, −4] | = hv[4, −2] | = −0.009 |
| hv[−2, 4] | = hv[−4, 2] | = hv[2, 4] | = hv[4, 2] | = −0.009 |
| hv[−4, −1] | = hv[−1, −4] | = hv[1, −4] | = hv[4, −1] | = 0.002 |
| hv[−1, 4] | = hv[−4, 1] | = hv[1, 4] | = hv[4, 1] | = 0.002 |
| hv[0, −4] | = hv[−4, 0] | = hv[0, 4] | = hv[4, 0] | = −0.013 |
| hv[−3, −3] | = hv[3, 3] | = hv[−3, 3] | = hv[3, −3] | = −0.029 |
| hv[−3, −2] | = hv[−2, −3] | = hv[2, −3] | = hv[3, −2] | = −0.015 |
| hv[−2, 3] | = hv[−3, 2] | = hv[2, 3] | = hv[3, 2] | = −0.015 |
| hv[−3, −1] | = hv[−1, −3] | = hv[1, −3] | = hv[3, −1] | = 0.018 |
| hv[−1, 3] | = hv[−3, 1] | = hv[1, 3] | = hv[3, 1] | = 0.018 |
| hv[0, −3] | = hv[−3, 0] | = hv[0, 3] | = hv[3, 0] | = 0.003 |
| hv[−2, −2] | = hv[2, 2] | = hv[−2, 2] | = hv[2, −2] | = 0.061 |
| hv[−2, −1] | = hv[−1, −2] | = hv[1, −2] | = hv[2, −1] | = −0.024 |
| hv[−1, 2] | = hv[−2, 1] | = hv[1, 2] | = hv[2, 1] | = −0.024 |
| hv[0, −2] | = hv[−2, 0] | = hv[0, 2] | = hv[2, 0] | = −0.026 |
| hv[−1, −1] | = hv[1, 1] | = hv[−1, 1] | = hv[1, −1] | = −0.086 |
| hv[0, −1] | = hv[−1, 0] | = hv[0, 1] | = hv[1, 0] | = 0.176 |
| hv[0, 0] | = 0.731 | | | |

As shown in FIG. 7a, the selected cutoff frequency is 50% of full bandwidth for the diagonal spatial frequencies. As shown in FIG. 7b, the selected cutoff frequency is approximately 72% of full bandwidth for the diagonal spatial frequencies. Both exemplary filter designs are implemented as 11 by 11 tap two-dimensional symmetrical output weighted FIR filters.

Two dimensional filters are described in a paper entitled, "Design Techniques for Two-Dimensional Digital Filters" by J. V. Hu and L. R. Rabiner, available from IEEE as IEEE Trans. on *Audio and Electroacoustics*, AU-20, No. 4, 249-257, Oct. 1972 which is hereby incorporated by reference for its teachings on the design and implementation of two-dimensional filters. In addition, two dimensional filters are also described in a book entitled, "*Theory and Application of Digital Signal Processing*" by L. R. Rabiner and B. Gold, available from Prentice-Hall, Inc., pages 438-83, 1975, which is also hereby incorporated by reference for its teachings on the design and implementation of two-dimensional filters.

Once the appropriate set of filter coefficients is selected, 2-D LPF 710 operates in a manner similar to a standard FIR filter. To generate a data value at a certain horizontal and vertical spatial position (denoted as hv[0,0] in Tables 3 and 4), 121 successive data values in selected spatial positions surrounding the data value being generated are multiplied by the appropriate coefficients shown in either Table 3 or 4, as appropriate, and then summed.

For example, in Tables 3 and 4, hv[−5, −5] represents a filter coefficient which is use to scale the applied data value located at a spatial position five horizontal samples before the spatial position of the data value being generated and five vertical samples above the vertical spatial position of the data value being generated. Likewise, hv[5,5] represents a filter coefficient which is to multiply the applied data value at a spatial position five horizontal samples after the horizontal spatial position of the data value being generated and five vertical samples below the data value being generated.

This multiplication and summation process is performed for all the spatial positions of the data values describing the image frame applied to the 2-D LPF 710.

The reduction in the spatial frequency content of the image frame by 2-D LPF 710 may increase the number of zero valued DCT coefficients generated by the quantizer 116. This may translate into a significant increase in the compression efficiency of the video encoding system because a sequential stream of zeros can be represented by relatively few bits using run length zero coding techniques. While up to 50% of the video spectrum of each image frame may be suppressed depending which filter is used, the picture quality is not noticeably affected since only high diagonal spatial frequencies are suppressed. In addition, in a fixed bandwidth system, the overall picture quality may be improved if the remaining coefficients are more finely quantized due to the reduced number of bits which may be needed on average to describe the blocks applied to the video encoding system.

Although the invention has been described in terms of an exemplary embodiment, it is contemplated that it may be practiced as outlined above within the spirit and scope of the appended claims.

What is claimed:

1. Apparatus for use in a video signal encoding system which digitally compresses data values representing image information, the system includes filtering apparatus which suppresses a range of relatively high diagonal spatial frequencies prior to image compression, the apparatus comprising:

means for receiving data values of a sampled data video signal which represent an image frame;

filtering means for filtering the received data values to selectively suppress signal components which occupy a range of relatively high diagonal spatial frequencies relative to signal components which occupy a corresponding range of relative high horizontal spatial frequencies and a corresponding range of relative high vertical spatial frequencies; and compression means for compressing said filtered data values which describe the image frame by applying a discrete cosine transformation to the filtered data values to produce coefficients representing the diagonal spatial frequency components, said coefficients having values which are small with respect to coefficients representing corresponding horizontal and vertical frequency components.

2. In a video signal encoding system which digitally compresses data values representing image information, a method for suppressing a range of relatively high diagonal spatial frequencies prior to image compression comprising the steps of:

a) receiving data values of a sampled data video signal which represent an image frame;

b) filtering the received data values to selectively suppress a range of high diagonal spatial frequencies in the image frame and for producing diagonally filtered data values; and c) compressing the filtered data values which describe the image frame by applying a discrete cosine transformation directly to said diagonally filtered data values.

3. Apparatus for use in a video signal encoding system which digitally compresses data values representing image information, the apparatus comprising:

means for receiving data values of a sampled data video signal which represent an image frame;

filtering means for filtering the received data values across the image frame to selectively suppress a range of high diagonal spatial frequencies relative to lower diagonal spatial frequencies in the image frame thereby reducing the entropy of the image frame and producing diagonally filtered data values; and compression means for compressing the filtered data values based on spatial frequency components of the filtered data values by applying a discrete cosine transformation directly to the diagonally filtered data values wherein the compression efficiency is increased by the filtering of the received data values.

4. Apparatus in claim 3 in which the filtering means includes a two dimensional finite impulse response filter.

5. Apparatus in claim 3 in which the filtering means includes:

means for filtering the received data values across the image frame to selectively suppress components of said image frame which occupy a range of high horizontal spatial frequencies relative to components that occupy a range of relatively low horizontal spatial frequencies; and means for filtering the received data values across the image frame to selectively suppress components of said image frame which occupy a range of high vertical spatial frequencies relative to components that occupy a range of relatively low vertical spatial frequencies.

6. Apparatus in claim 5 in which the filtering means includes first and second finite impulse response filters wherein the first filter suppresses the range of high horizontal frequencies and the second filter suppresses the range of high vertical frequencies.

7. Apparatus in claim 3 in which the compression means includes:

frequency determination means for determining relative amplitudes of respective ones of the spatial frequency components of the filtered data values.

8. Apparatus in claim 7 in which the compression means further includes:

quantizing means for assigning data values representing the determined relative amplitudes of each of said spatial frequency components.

9. Apparatus in claim 8 in which the compression means further includes:

encoding means for encoding said assigned data values to produce a smaller number of encoded data values having an entropy substantially equal to the entropy of the assigned data values provided by the quantizer means.

10. Apparatus in claim 9 in which the frequency determination means includes means for determining the discrete cosine transform coefficients for the filtered data values.

11. Apparatus in claim 10 in which the encoding means includes means for performing run length coding of said assigned data values.

12. In a video signal encoding system which digitally compresses data values representing image information, a method encoding the data values comprising the steps of:
   a) receiving data values of a sampled data video signal which represent an image frame;
   b) filtering the received data values across the image frame to selectively suppress a range of high diagonal spatial frequencies relative to lower diagonal spatial frequencies in the image frame, thereby reducing the entropy of the image frame and for producing diagonally filtered data values; and
   c) compressing the filtered data values which describe the image frame wherein the compression efficiency is increased by the filtering of the received data values by applying a discrete cosine transform directly to the diagonally filtered data values.

13. The method of claim 12 in which step b) includes the step of filtering the received values in two dimensions.

14. The method of claim 12 in which step b) includes the steps of:
   b1) filtering the received data values across the image frame to selectively suppress components of said image frame which occupy a range of high horizontal spatial frequencies relative to components that occupy a range of relatively low horizontal spatial frequencies; and
   b2) filtering the received data values across the image frame to selectively suppress components of said image frame which occupy a range of high vertical spatial frequencies relative to components that occupy a range of relatively low vertical spatial frequencies.

15. The method of claim 14 in which step b1) includes the step of filtering the received data values using a finite impulse response filter to suppress the range of high horizontal frequencies and step b2) includes the step of filtering the received data values using a further finite impulse response filter to suppress the range of high vertical frequencies.

16. The method of claim 12 in which step c) includes the step of:
   c1) determining the relative amplitudes of certain frequencies in the filtered data values.

17. The method of claim 16 which step c) further includes the step of:
   c2) assigning data values representing the determined relative amplitudes of each of said certain frequencies.

18. The method of claim 17 which step c) further includes the step of:
   c3) encoding said assigned data values to produce a smaller number of encoded data values having an entropy substantially equal to the entropy of the assigned data values provided by step c1).

19. The method of claim 18 in which the step c1) includes the step of calculating a set of discrete cosine transform coefficients for the filtered data values.

20. The method of claim 18 in which the step c3) includes the step of run-length coding the assigned data values produced by step c2).

* * * * *